United States Patent [19]
Mahant-Shetti et al.

[11] Patent Number: 5,345,196
[45] Date of Patent: Sep. 6, 1994

[54] METHOD AND APPARATUS FOR CURRENT AND VOLTAGE CONTROL OF AN OSCILLATOR

[75] Inventors: Shivaling S. Mahant-Shetti, Richardson; John W. Fattaruso, Dallas, both of Tex.

[73] Assignee: Texas Instruments Incorporated, Dallas, Tex.

[21] Appl. No.: 88,993

[22] Filed: Jul. 7, 1993

[51] Int. Cl.$^5$ ............................................. H03K 3/354
[52] U.S. Cl. ..................................... 331/111; 331/143; 331/177 R; 307/296.8
[58] Field of Search ................. 331/111, 143, 177 R; 307/296.1, 296.6, 296.8

[56] References Cited

U.S. PATENT DOCUMENTS

| | | | |
|---|---|---|---|
| 4,714,901 | 12/1987 | Jain et al. | 331/111 X |
| 4,723,114 | 2/1988 | D'Arrigo et al. | 331/111 |
| 4,983,931 | 1/1991 | Nakano | 331/111 |

OTHER PUBLICATIONS

"LM566C Voltage Controlled Oscillator," *Special Purpose Linear Devices Data Book*, National Semiconductor, 1989, pp. 572–575.

*Primary Examiner*—Siegfried H. Grimm
*Attorney, Agent, or Firm*—Douglas A. Sorensen; Richard A. Donaldson; William E. Hiller

[57] ABSTRACT

A variable frequency oscillator (19) and method of producing an oscillating signal are provided in which a current mirror (12) receives a control current and generates a mirrored current. A capacitor (20) is coupled to the current mirror (12) and charges and discharges through the current mirror (12) based on the direction of the mirrored current. A trigger (22) is coupled to the capacitor (20) and outputs a first voltage level when the capacitor (20) charges to a first voltage threshold and outputs a second voltage level when the capacitor (20) discharges to a second voltage threshold. A switch (14) is coupled to the current mirror (12) and the trigger (22) for changing the direction of the mirrored current based on the output voltage of the trigger (22).

20 Claims, 1 Drawing Sheet

METHOD AND APPARATUS FOR CURRENT AND VOLTAGE CONTROL OF AN OSCILLATOR

TECHNICAL FIELD OF THE INVENTION

This invention relates generally to electronic circuits, and more particularly to a method and apparatus for current and voltage control of an oscillator.

BACKGROUND OF THE INVENTION

The ever pressing demand for increased functionality from integrated circuit chips requires an increase in the number of circuit components on each chip. To accommodate this need, circuit designers are continually searching for ways of reducing the number of components—usually transistors—required to perform a particular circuit function. One such circuit function is that of oscillators.

Applications for oscillators are widespread. Typically, the frequency of an oscillator is controlled by either a control current or a control voltage. The level of the control current or control voltage determines how quickly a capacitor is charged and discharged, thus providing the frequency of the oscillator.

Circuitry for controlling the charging and discharging of the capacitor comprises a large portion of the chip area taken up by the oscillator.

SUMMARY OF THE INVENTION

Therefore, a need has arisen for a variable frequency oscillator that uses fewer components, thereby providing integrated circuit area savings.

In accordance with the teachings of the present invention, a variable frequency oscillator and method of generating an oscillating signal are provided which substantially eliminate or reduce disadvantages with prior art oscillators and methods of generating oscillating signals.

In particular, an oscillator is provided which includes a current mirror for receiving a control current and generating a mirrored current. A capacitor is coupled to the current mirror and charges and discharges through the current mirror based on the direction of the mirrored current. A trigger is coupled to the capacitor and outputs a first voltage level when the capacitor charges to a first voltage threshold, and outputs a second voltage level when the capacitor discharges to a second voltage threshold. A switch is coupled to the current mirror and to the trigger, and changes the direction of the mirrored current based on the output voltage of the trigger.

The control current can also be controlled by a control voltage, thereby providing for voltage controlled oscillation.

A method of generating an oscillating signal is also provided in which a mirrored current is generated based on a control current. A capacitor is then charged or discharged based on the direction of the mirrored current. The first voltage level is output as the oscillating signal when the capacitor charges to a first voltage threshold, and a second voltage is output when the capacitor discharges to a second voltage threshold. The direction of the mirrored current is changed based on the output voltage of the trigger.

An important technical advantage of the present invention is the fact that circuitry for charging and discharging the capacitor requires very few components, thereby providing important chip area savings.

BRIEF DESCRIPTION OF THE DRAWINGS

For a more complete understanding of the present invention and the advantages thereof, reference is now made to the following description taken in conjunction with the accompanying drawings in which like reference numbers indicate like features wherein.

DETAILED DESCRIPTION OF THE INVENTION

Figure 1:
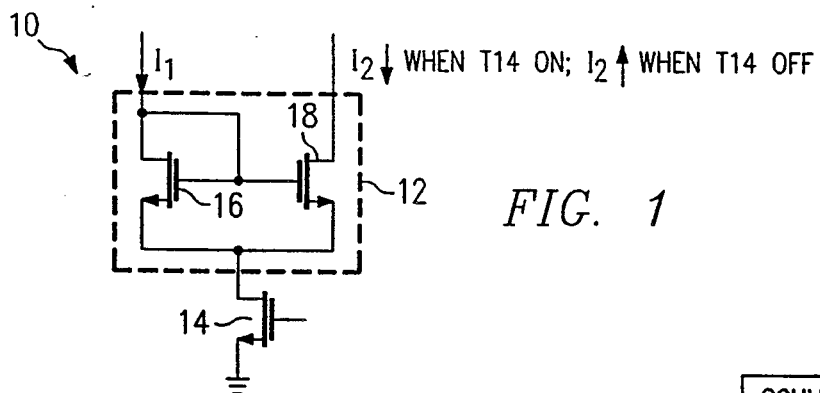
FIG. 1 illustrates a bi-directional current mirror constructed according to the teachings of the present invention.

FIG. 1 illustrates a bi-directional current mirror 10 (or bi-directional current source) constructed according to the teachings of the present invention. As shown in FIG. 1, current mirror 12 is coupled to a switch, which in a particular embodiment is a transistor 14. The current mirror 12 comprises transistors 16 and 18. The gates of transistor 16 and 18 are coupled together, and coupled to the drain of transistor 16. Furthermore, the sources of transistors 16 and 18 are commonly coupled, and coupled to the drain of transistor 14. The source of transistor 14 is coupled to ground.

In operation of bi-directional current mirror 10, a control current $I_1$ is provided to transistor 16 as shown in FIG. 1. This control current $I_1$ controls the magnitude of $I_2$, a mirrored current, which is the current flowing through transistor 18. The magnitude of $I_2$ depends on the magnitude of $I_1$ and the widths of transistors 16 and 18. When the widths of transistors 16 and 18 are equal, for example, the magnitude of $I_2$ will equal that of $I_1$, under proper circuit operating conditions.

The direction of $I_2$ depends on the state of the switch, transistor 14. If transistor 14 is on (the switch closed), then $I_2$ flows through transistor 18 towards transistor 14 and to ground. If transistor 14 is off (the switch open), then $I_2$ flows out of the drain of transistor 18 as indicated in FIG. 1. With transistor 14 off, the drain and source of transistor 18 are actually inverted, and transistor 18 operates as an extension to the gate length of transistor 16. Thus, with transistor 14 off, transistor 16 and 18 operate as a single diode-connected transistor with additional gate length. With transistor 14 off, therefore, the magnitude of $I_2$ is substantially equal to that of $I_1$. The state of transistor 14 is controlled by the voltage on its gate.

Figure 2:
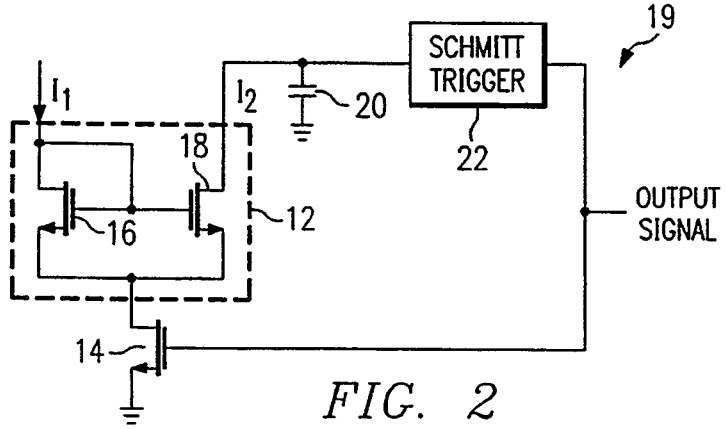
FIG. 2 illustrates a current controlled oscillator constructed according to the teachings of the present invention.

FIG. 2 illustrates a current controlled oscillator 19 constructed according to the teachings of the present invention. As shown in FIG. 2, capacitor 20 is coupled between the drain of transistor 18 and ground. The drain of transistor 18 is also coupled to the input of a trigger, which in a particular embodiment is Schmitt trigger 22. The output of Schmitt trigger 22 is coupled to the gate of transistor 14.

In operation of the current controlled oscillator 19 of FIG. 2, the control current, $I_1$, is provided to current mirror 12. Depending on the state of transistor 14, capacitor 20 will either be charged or discharged through current mirror 12 by mirrored current $I_2$. Because the magnitude of $I_2$ is related to the magnitude of $I_1$, as described above, the magnitude of control current $I_1$ controls the rate at which capacitor 20 is charged and discharged, and thus the frequency of oscillation. Furthermore, an embodiment with the width of transistor 16 different than that of transistor 18 will produce a charging rate that is different than the discharging rate, thereby allowing for variations in the duty cycle of the output wave. With the widths the same, a substantially 50% duty cycle results.

Schmitt trigger 20 outputs a voltage, for example 5 volts, when capacitor 20 is charged to a particular high voltage threshold. Once this high voltage threshold is reached, the output of Schmitt trigger 22 will cause transistor 14 to turn on, thereby reversing the current direction of $I_2$ towards ground. This will result in capacitor 20 discharging. When capacitor 20 discharges to a particular low voltage threshold, the output of Schmitt trigger 22 will drop to a low voltage output level, for example 0 volts. This low voltage output level of Schmitt trigger 22 will in turn cause transistor 14 to turn off, thereby again reversing the direction of current $I_2$, resulting in the charging of capacitor 20. As capacitor 20 is charged again, Schmitt trigger 22 will output its high voltage output level when capacitor 20 is charged to the high voltage threshold, as discussed above. This process continues, providing the appropriate oscillator output signal. The output signal of the oscillator 19 is taken from the output of Schmitt trigger 22.

The high voltage threshold and the low voltage threshold at which Schmitt trigger 22 changes its output voltage level may be adjusted as needed for the requirements of the system. By adjusting these levels, the frequency of the output wave form may be adjusted.

Figure 3:
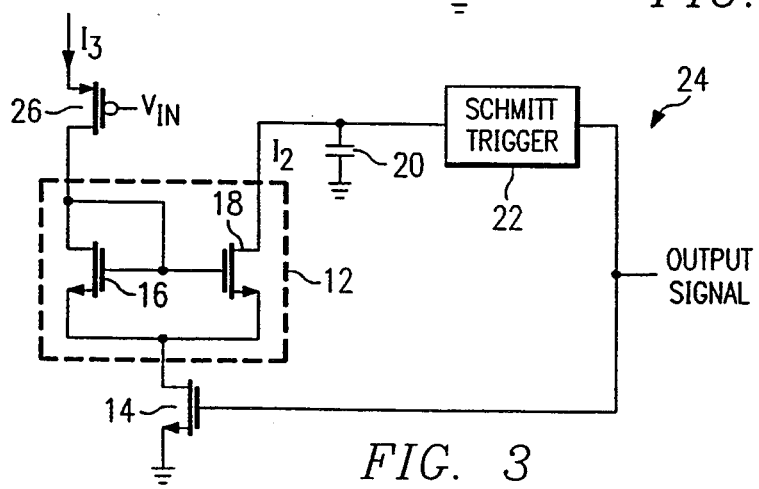
FIG. 3 illustrates a voltage controlled oscillator constructed according to the teachings of the present invention.

FIG. 3 illustrates a voltage controlled oscillator 24 constructed according to the teachings of the present invention. Voltage controlled oscillator 24 is constructed and operates like current controlled oscillator 19, except that transistor 26 is included as shown in FIG. 3. Transistor 26 is coupled between a constant current source $I_3$ and current mirror 12. The voltage control input, $V_{in}$, is input to the gate of transistor 26.

As the input voltage $V_{in}$ increases, transistor 26 is turned "harder" on, thus allowing more current to pass through transistor 26. The current passing through transistor 26 is a control current. Thus, as $V_{in}$ increases, the frequency of voltage controlled oscillator 24 will increase. As $V_{in}$ decreases, the frequency of voltage controlled oscillator 24 decreases.

Figure 4A:
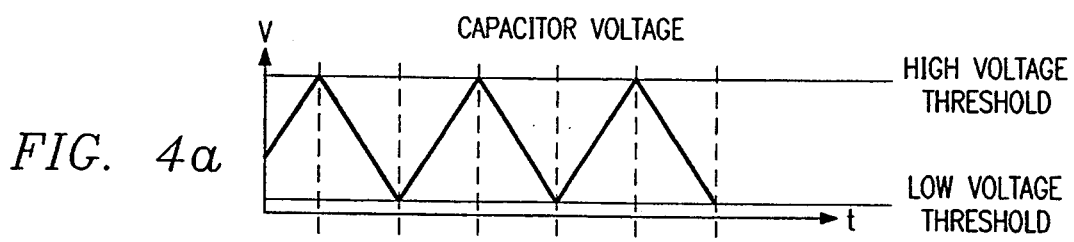
FIGS. 4a and 4b illustrate characteristic wave forms of the oscillators of FIGS. 2 and 3.
Figure 4B:
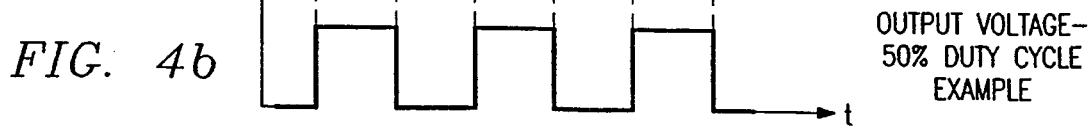

FIGS. 4a and 4b illustrate wave forms associated with the oscillators shown in FIGS. 2 and 3. FIG. 4a illustrates the voltage across capacitor 20. As can be seen by FIG. 4a, the voltage across the capacitor 20 increases until transistor 14 is turned on, at which time capacitor 20 discharges. Capacitor 20 begins to charge again when transistor 14 is turned off.

FIG. 4b is a graph of the output voltage of the oscillators shown in FIGS. 2 and 3. As shown in FIG. 4b, Schmitt trigger 22 changes states when the voltage on capacitor 20 crosses the high voltage and low voltage thresholds. It should be understood that devices other than Schmitt trigger 22, such as comparators, may be used to generate the output of the oscillators without departing from the intended scope of the present invention.

Conventional notations have been used in the drawings of this disclosure. Thus, for example, transistors 16 and 18 are N-channel field effect transistors, and transistor 26 is a P-channel field effect transistor. The embodiments described herein are particularly suited for metal oxide semiconductor (MOS) technologies. However, the present invention may be implemented with other technologies without departing from the intended scope herein. Furthermore, current mirror 12, as discussed above, describes a particular current mirror which may be used as part of the present invention. Other current mirrors may also be used without departing from the intended scope herein.

Although the present invention has been described in detail, it should be understood that various changes, substitutions and alterations can be made without departing from the spirit and scope of the invention as defined by the appended claims.

What is claimed is:

1. A variable frequency oscillator, comprising:
   a current mirror operable to receive a control current and to generate a mirrored current;
   a capacitor coupled to said current mirror and operable to charge and discharge through the current mirror based on the direction of said mirrored current;
   a trigger coupled to said capacitor, said trigger operable to output a first voltage level when said capacitor charges to a first voltage threshold and to output a second voltage level when said capacitor discharges to a second voltage threshold; and
   a switch coupled to said current mirror and said trigger, said switch operable to change the direction of said mirrored current based on the output voltage of said trigger.

2. The oscillator of claim 1, wherein said trigger comprises a Schmitt trigger.

3. The oscillator of claim 1, wherein the frequency of oscillation is based on the magnitude of said control current.

4. The oscillator of claim 1, wherein said switch comprises a MOS transistor having a gate, said gate coupled to said trigger.

5. The oscillator of claim 1, wherein the frequency of oscillation is based on said first and second voltage thresholds.

6. The oscillator of claim 1, wherein the oscillator output duty cycle is 50 percent.

7. A variable frequency oscillator, comprising:
   a control voltage operable to generate a control current, the magnitude of said control current based on the magnitude of said control voltage;
   a current mirror operable to receive said control current and to generate a mirrored current;
   a capacitor coupled to said current mirror and operable to charge and discharge through said current mirror based on the direction of said mirrored current;
   a trigger coupled to said capacitor, said trigger operable to output a first voltage level when said capacitor charges to a first voltage threshold and to output a second voltage level when said capacitor discharges to a second voltage threshold; and
   a switch coupled to said current mirror and said trigger, said switch operable to change the direction of said mirrored current based on the output voltage of said trigger.

8. The oscillator of claim 7, and further comprising a transistor having a gate coupled to said control voltage, said control current output by said transistor based on the control voltage.

9. The oscillator of claim 7, wherein said trigger comprises a Schmitt trigger.

10. The oscillator of claim 7, wherein the frequency of oscillation is based on the magnitude of said control voltage.

11. The oscillator of claim 7, wherein said switch comprises a MOS transistor having a gate, said gate coupled to said trigger.

12. The oscillator of claim 7, wherein the frequency of oscillation is based on said first and second voltage thresholds.

13. The oscillator of claim 7, wherein the oscillator output duty cycle is 50 percent.

14. A method of generating an oscillating signal, comprising the steps of:
   generating a mirrored current based on a control current;
   charging and discharging a capacitor based on the direction of the mirrored current;
   outputting a first voltage level when the capacitor charges to a first voltage threshold and outputting a second voltage level when the capacitor discharges to a second voltage threshold; and
   changing the direction of the mirrored current based on the outputting of the first and second voltage levels.

15. The method of claim 14, wherein the frequency of the oscillating signal is based on the magnitude of the control current.

16. The method of claim 14, wherein the frequency of the oscillating signal is based on the first and second voltage thresholds.

17. The method of claim 14, wherein the duty cycle of the oscillating signal is 50 percent.

18. A bi-directional current source, comprising:
   a current mirror operable to receive a control current and generate an output current; and
   a switch coupled to said current mirror and operable to change the direction of said output current, such that said output current flows in a first direction when said switch is open and said output current flows opposite said first direction when said switch is closed.

19. The bi-directional current source of claim 18, wherein said current mirror comprises:
   a first transistor having a first drain, a first gate, and a first source, said first drain and first gate coupled to said control current, said first source coupled to said switch; and
   a second transistor having a second drain, a second gate, and a second source, said second gate coupled to said first gate, said second source coupled to said first source, and said output current flowing through said second drain.

20. The bi-directional current source of claim 18, wherein the magnitude of said output current is substantially equal to said control current when said switch is open.

* * * * *